United States Patent [19]
Kim et al.

[11] Patent Number: 5,834,329
[45] Date of Patent: Nov. 10, 1998

[54] LASER DIODE AND METHOD FOR FABRICATING THE SAME

[75] Inventors: Ang Seo Kim; Don Soo Kim; Sang Yong Lee; Young Kun Sin, all of Kyoungki-do, Rep. of Korea

[73] Assignee: Hyundai Electronics Industries Co., Ltd., Kyoungki-do, Rep. of Korea

[21] Appl. No.: 730,448

[22] Filed: Oct. 15, 1996

[30] Foreign Application Priority Data

Oct. 16, 1995 [KR] Rep. of Korea .................. 1995-35644

[51] Int. Cl.$^6$ .................................................. H01L 21/203
[52] U.S. Cl. .................. 438/40; 438/39; 438/38
[58] Field of Search .................. 438/39, 40, 42, 438/43, 46, 47, 38; 372/7, 45

[56] References Cited

U.S. PATENT DOCUMENTS

| | | |
|---|---|---|
| 5,001,080 | 3/1991 | Wada et al. . |
| 5,242,839 | 9/1993 | Oh et al. . |
| 5,307,357 | 4/1994 | Jost et al. ..................................... 372/7 |
| 5,658,824 | 8/1997 | Itoh et al. .................................. 438/38 |

*Primary Examiner*—Charles L. Bowers, Jr.
*Assistant Examiner*—Keith Christianson
*Attorney, Agent, or Firm*—Gary M. Nath; Nath & Associates

[57] ABSTRACT

A ridge wavegide laser diode, with an inverse mesa structure, resistant to heat and improved in the adhesion of a contact metal to a contact layer, which can be obtained by forming a polyimide spacer in such a way that polyimide remains only at the lower part of the corner of the inverse mesa structure. In the diode, the contact metal is minimally broken off at the opposite sides of the mesa structure.

6 Claims, 3 Drawing Sheets

LASER DIODE AND METHOD FOR FABRICATING THE SAME

BACKGROUND OF THE INVENTION

1. Filed of the invention

The present invention relates, in general, to an RWG (ridge wavegide) laser diode with an inverse mesa structure and, more particularly, to an RWG laser diode, which has a stable level of heat that results in improved reliability and production yield. Also, the present invention is concerned with a method for fabricating the same.

2. Description of the Prior Art

An RWG laser diode, which is an element generating optical signals with various information, is used for optical signal-transmission by optical fiber, including optical communication systems, optical CATV system and wide range ISDN.

In order to better understand the background of the invention, a structure of a conventional RWG laser diode will be described below, in connection with FIG. 1.

FIG. 1 shows an RWG laser diode with a perpendicular mesa structure. Over an $n^+$-InP substrate 1, there are, in sequence, deposited an $n^+$-InP buffer layer 2, an active layer 3, a p-InP clad layer 4, and a contact layer 5, for example, a $p^+$-InGaAs or $p^+$-InGaAsP layer. Thereafter, the contact layer 5 and the p-InP clad layer 4 are etched selectively and vertically to a predetermined depth of the p-InP clad layer 4 by, for example, lithography. Then, a silicon oxide film 6 is formed over the resulting structure, after which the contact layer 5 is selectively exposed. Contact metal 7, for example, Ti/Pt/Au, is then formed over the whole structure, including the exposed part of the contact layer 5. Finally, contact metal 7 is covered with a blanket of gold 8.

The RWG laser diode shown in FIG. 1 is called a perpendicular RWG laser diode because the mesa structure constituting a ridge is at an angle of about 90°. In this RWG laser diode, if the width W of the mesa is below 3 $\mu$m, the contact part of the contact layer 5 with the contact metal 7 narrows, leading to an increase in contact resistance. Further, since the narrow width of the mesa is maintained down to the contact layer 5, series resistance also increases, resulting in deterioration of the properties of the laser diode.

Recently, it has been suggested that when the connection of the metal is poor due to the shape of inverse mesa structure, a planarized polyimide protecting film is employed beside the inverse mesa. However, polyimide has been found to be poor in adhesion to metal and susceptible to heat.

SUMMARY OF THE INVENTION

Therefore, it is an objective of the present invention to overcome the above problems encountered in prior arts and to provide an inverse mesa RWG laser diode in which a polyimide protecting film is formed only at the lower edge parts of the inverse mesa structure which prevents the contact metal from being broken off at the opposite sides of the inverse mesa.

It is another objective of the present invention to provide a method for fabricating the inverse mesa RWG laser diode.

In accordance with an aspect of the present invention, there is provided a laser diode, comprising of the steps: forming a buffer layer, an active layer, a clad layer and a contact layer in sequence over an InP substrate thus, forming an etching mask on the contact layer and carrying out a wet etch process from the contact layer to a predetermined depth of the clad layer to construct an inverse mesa then removing the etching mask; depositing a silicon oxide film entirely over the resulting structure; coating polyimide on the silicon oxide film; entirely etching the polyimide down to a predetermined depth to expose the silicon oxide film on the inverse mesa and etching the exposed silicon oxide film to expose the contact layer below then, subjecting the polyimide to anisotropic etch to form a polyimide spacer at the side wall of the inverse mesa structure; and depositing a contact metal entirely over the resulting structure, to bring the contact metal into contact with the contact layer.

In accordance with another aspect of the present invention, there is provided a ridge wavegide laser diode having an inverse mesa structure, comprising of: an InP substrate; a buffer layer and an active layer, which are deposited over said InP substrate, in sequence; a p-clad layer with the inverse mesa structure, deposited on aid active layer. A silicon oxide film is then formed at the side wall of the inverse mesa structure and on the p-clad layer; a polyimide spacer formed on the p-clad layer at the side wall of the mesa structure; and a contact metal electrically connected with said contact layer, covering all said contact layer, said polyimide spacer and said p-clad layer.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
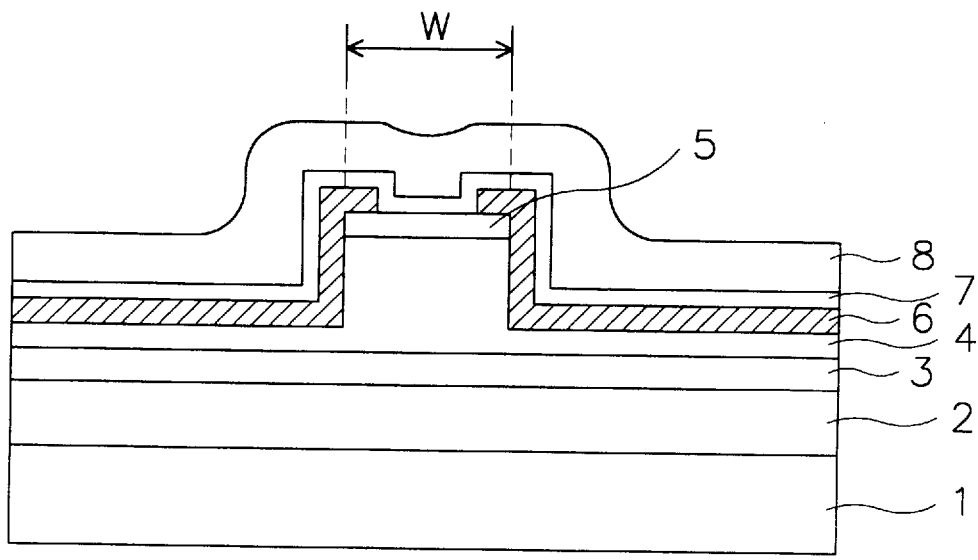
FIG. 1 is a schematic cross sectional view showing a conventional RWG laser diode with a perpendicular mesa structure.

The application of the preferred embodiments of the present invention is best understood with reference to the accompanying drawings, wherein like reference numerals are used for like and corresponding parts, respectively.

Referring to FIGS. 2 through 6, there are illustrated stepwise processes for fabricating a laser diode according to the present invention.

Figure 2:
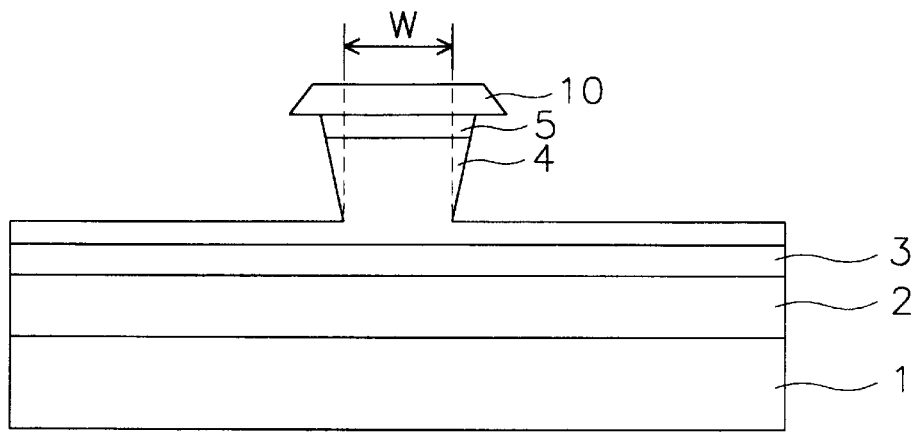
FIGS. 2 through 6 are schematic cross sectional views showing stepwise processes for fabricating a RWG laser diode with an inverse mesa structure, according to the present invention.

An inverse mesa structure is constructed as shown in FIG. 2. For this, first, an $n^+$-InP buffer layer 2, an active layer 3, a p-InP clad layer 4 and a contact layer 5, for example, $p^+$-InGaAs or InGaAsP layer, are, in sequence, deposited on an $n^+$-InP substrate 1, and then an etching mask 10 is formed on the contact layer 5. Subsequently, utilizing the etching mask 10, a wet etch process is carried out from the contact layer 5 down to a predetermined depth of the p-InP clad layer 4, to provide the inverse mesa structure.

Figure 3:
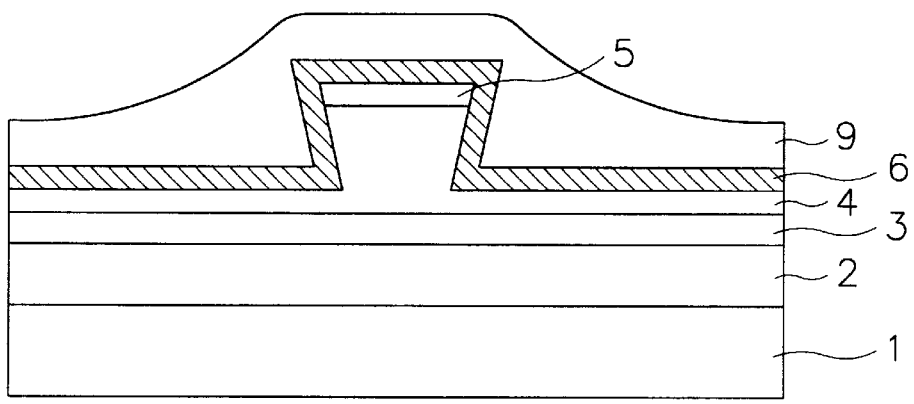

FIG. 3 is a schematic cross sectional view after the etching mask 10 is removed and a silicon oxide film 6 is deposited over the resulting structure in a PECVD process, followed by the spincoating and curing of a polyimide layer 9.

Figure 4:
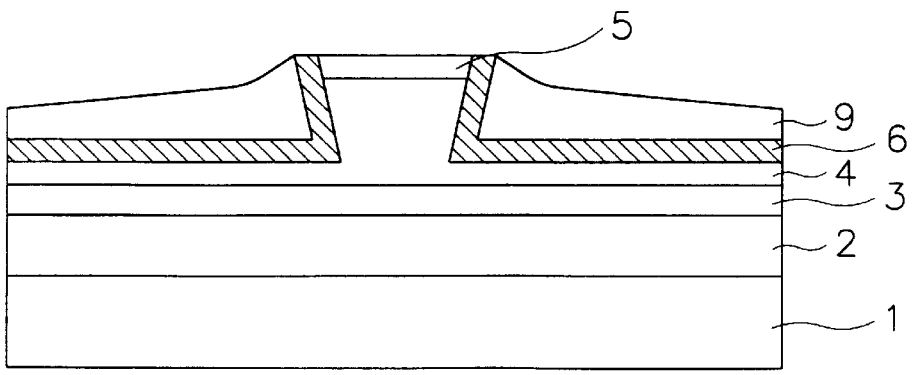

FIG. 4 is a schematic cross sectional view after the etching is done, with oxygen plasma and then, with $CF_4$+ $CHF_3$ plasma. Upon etching with oxygen plasma, the polyimide layer 9 is etched down to a predetermined depth to remove the polyimide covering the inverse mesa structure and to planarize the polyimide beside the inverse mesa structure. Upon etching with $CF_4+CHF_3$ plasma, the exposed part of the silicon oxide 9, covering the inverse mesa structure, is removed.

Figure 5:
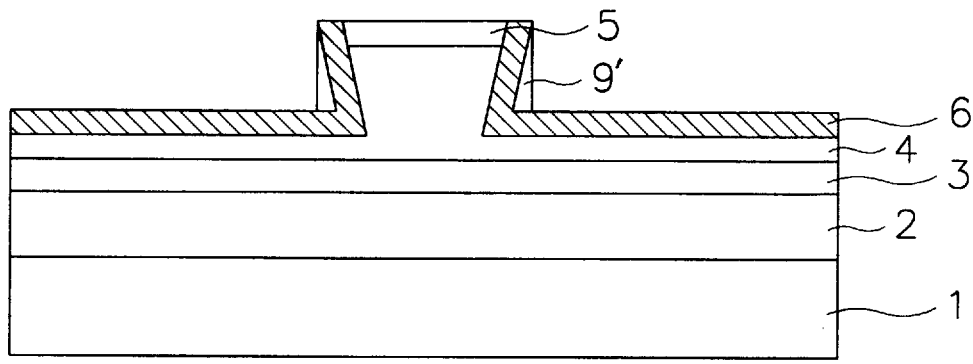

FIG. 5 is a schematic cross sectional view taken after the polyimide is subjected to anisotropic etch to form a polyimide spacer 9' at the side wall of the inverse mesa structure. Anisotropic etch is carried out at 30 mTorr in oxygen and argon plasma.

Figure 6:
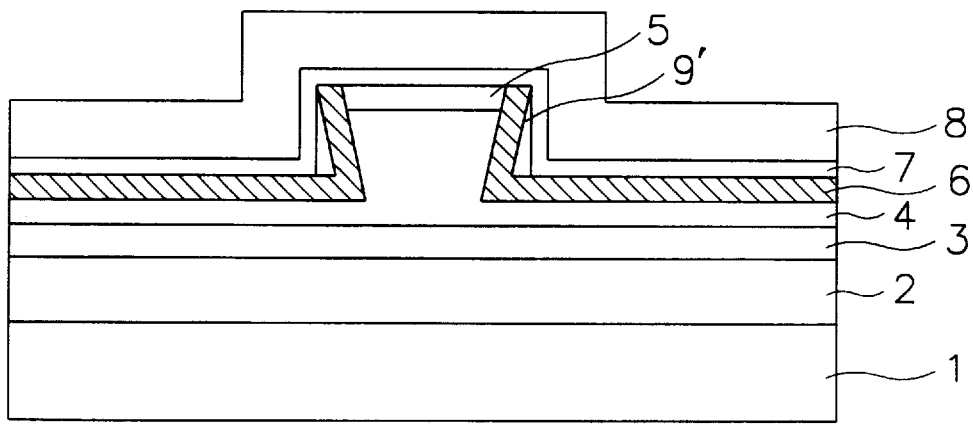

FIG. 6 is a schematic cross sectional view taken after a contact metal layer 7 is formed entirely over the resulting structure, followed by the deposition of a gold-plate metal 8 over the contact metal layer 7. The formation of the polyimide spacer 9' has the effect of turning the inverse mesa structure into a perpendicular mesa structure, in which the contact metal 7 is in contact with the silicon oxide film 6 at an area larger than in the conventional perpendicular one and thereby, strengthening the adhesion of the contact metal 7. As a result, the contact metal 7 is minimally peeled off, even when the laser diodes are separated individually.

As described hereinbefore, the inverse mesa-structured RWG laser diode of the present invention has a p-clad layer wider than that of the conventional perpendicular one, leading to a decrease in contact resistance and series resistance. In addition, polyimide, vulnerable to heat, can be used in a minimal amount, without deteriorating the connection of the contact metal, by filling polyimide only at the lower part of the inverse mesa. In this way low thermal resistance laser diodes can be obtained. Furthermore, the greatest part of the contact metal is in contact with the silicon oxide film and is effective as an adhesive, so that the contact metal is minimally peeled off when separating laser diodes individually. Consequently, according to the present invention, there is a significant increase in the production yield and the reliability of the laser diode.

The present invention has been described in an illustrative manner, and it is to be understood that the terminology used is intended to be in the nature of description rather than of limitation.

Many modifications and variations of the present invention are possible in light of the above teachings. Therefore, it is to be understood that within the scope of the appended claims, the invention may be practiced in ways other than those specifically described.

What is claimed is:

1. A method for fabricating a ridge waveguide laser diode having an inverse mesa structure, comprising the steps of:

forming a buffer layer, an active layer, a clad layer and a contact layer in sequence over an InP substrate;

forming an etching mask on the contact layer and carrying out a wet etch process from the contact layer to a predetermined depth of the clad layer to construct an inverse mesa;

removing the etching mask;

depositing a silicon oxide film entirely over the resulting structure;

coating polyimide on the silicon oxide film;

entirely etching the polyimide down to a predetermined depth in order to expose the silicon oxide film on the inverse mesa and etching the exposed silicon oxide film to expose the contact layer below;

subjecting the polyimide to anisotropic etch to form a polyimide spacer at the side wall of the inverse mesa structure; and depositing a contact metal entirely over the resulting structure, to bring the contact metal into contact with the contact layer.

2. A method in accordance with claim 1, wherein said contact layer is a $p^+$-InGaAs or $p^+$-InGaAsP layer.

3. A method in accordance with claim 1, wherein said silicon oxide film is deposited in a PECVD process.

4. A method in accordance with claim 1, wherein said polyimide is spin coated and cured.

5. A method in accordance with claim 1, wherein said silicon oxide film is etched in a mixture of $CF_4$ and $CHF_3$ plasma.

6. A method in accordance with claim 1, wherein said anisotropic etch is carried out in oxygen and argon plasma.

* * * * *